(12) United States Patent
Su et al.

(10) Patent No.: US 10,559,601 B2
(45) Date of Patent: Feb. 11, 2020

(54) ARRAY SUBSTRATE AND METHOD FOR MANUFACTURING THE SAME

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Tongshang Su, Beijing (CN); Jun Cheng, Beijing (CN); Ce Zhao, Beijing (CN); Bin Zhou, Beijing (CN); Dongfang Wang, Beijing (CN); Guangcai Yuan, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 127 days.

(21) Appl. No.: 15/580,240

(22) PCT Filed: Jun. 23, 2017

(86) PCT No.: PCT/CN2017/089717
§ 371 (c)(1),
(2) Date: Dec. 6, 2017

(87) PCT Pub. No.: WO2018/054111
PCT Pub. Date: Mar. 29, 2018

(65) Prior Publication Data
US 2019/0221588 A1    Jul. 18, 2019

(30) Foreign Application Priority Data

Sep. 26, 2016 (CN) .......................... 2016 1 0849162

(51) Int. Cl.
*H01L 27/14* (2006.01)
*H01L 29/15* (2006.01)
(Continued)

(52) U.S. Cl.
CPC ...... *H01L 27/1233* (2013.01); *G02F 1/13306* (2013.01); *G09G 3/3283* (2013.01);
(Continued)

(58) Field of Classification Search
None
See application file for complete search history.

(56) References Cited

U.S. PATENT DOCUMENTS

2005/0070055 A1\* 3/2005 Kunii .................. H01L 27/1214
438/151
2016/0035760 A1\* 2/2016 Ning .................. H01L 27/1248
257/43

(Continued)

FOREIGN PATENT DOCUMENTS

CN        1540602 A    10/2004
CN      101101420 A     1/2008
(Continued)

OTHER PUBLICATIONS

International Search Report & Written Opinion, for PCT Patent Application No. PCT/CN2017/089717, dated Sep. 20, 2017, 26 pages.

*Primary Examiner* — Calvin Y Choi
(74) *Attorney, Agent, or Firm* — Kinney & Lange, P.A.

(57) ABSTRACT

The present disclosure relates to an array substrate and a method for manufacturing the same. The array substrate includes a thin film transistor and comprises at least a first region and a second region. A thickness of an active layer of the thin film transistor in the first region is different from that of an active layer of the thin film transistor in the second (Continued)

region. A ratio of the overlapped area between the source electrode or the drain electrode and the active layer of the thin film transistor to the thickness of the active layer is kept uniform over the first region and the second region.

18 Claims, 3 Drawing Sheets

(51) Int. Cl.
| | | |
|---|---|---|
| *H01L 31/036* | (2006.01) | |
| *H01L 27/12* | (2006.01) | |
| *G02F 1/133* | (2006.01) | |
| *G09G 3/3283* | (2016.01) | |
| *G09G 3/3291* | (2016.01) | |
| *H01L 29/417* | (2006.01) | |
| *H01L 51/05* | (2006.01) | |
| *H01L 27/28* | (2006.01) | |
| *H01L 51/10* | (2006.01) | |
| *H01L 27/32* | (2006.01) | |

(52) U.S. Cl.
CPC .......... *G09G 3/3291* (2013.01); *H01L 27/124* (2013.01); *H01L 27/127* (2013.01); *H01L 27/1259* (2013.01); *H01L 27/283* (2013.01); *H01L 27/3262* (2013.01); *H01L 29/41733* (2013.01); *H01L 51/0558* (2013.01); *H01L 51/102* (2013.01); *H01L 27/3276* (2013.01)

(56) References Cited

U.S. PATENT DOCUMENTS

| 2016/0093251 A1* | 3/2016 | Chung | G09G 3/3275 |
| | | | 345/207 |
| 2016/0104803 A1* | 4/2016 | Ahn | H01L 29/78696 |
| | | | 257/59 |

FOREIGN PATENT DOCUMENTS

| CN | 101325220 A | 12/2008 |
| CN | 101656270 A | 2/2010 |
| CN | 105116653 A | 12/2015 |
| CN | 106356378 A | 1/2017 |
| GB | 2326019 A | 12/1998 |

* cited by examiner

ARRAY SUBSTRATE AND METHOD FOR MANUFACTURING THE SAME

CROSS-REFERENCE TO RELATED APPLICATION(S)

The present application claims priority to a Chinese Patent Application No. 201610849162.1 filed on Sep. 26, 2016, the entire contents of which are hereby incorporated by reference as part of this application.

TECHNICAL FIELD

Embodiments of the present disclosure relate to a field of display technology, and in particular, to an array substrate and a method for manufacturing the same.

BACKGROUND

Thin film transistors (TFTs) are field effect transistors formed from multiple layers of thin films, such as active semiconductor layers, dielectric layers and metal electrode layers. Due to their advantages of being suitable for integration and mass production, TFTs functioning as display control units play an very important role in the field of flat panel display such as liquid crystal display (LCD), organic light emitting diode display (OLED), electronic paper display (EPD). Therefore, there is a requirement to continuously improve display performance of the TFT-integrated display panel.

SUMMARY

Embodiments of the present disclosure provide an array substrate, a method for manufacturing the same, a display panel and a display device, which may improve the display performance.

According to a first aspect of the present disclosure, there is provided an array substrate including a thin film transistor and having at least a first region and a second region. A thickness of an active layer of the thin film transistor in the first region is greater than that of an active layer of the thin film transistor in the second region, and an overlapped area between a source electrode or a drain electrode and the active layer of the thin film transistor in the first region is larger than that between a source electrode or a drain electrode and the active layer of the thin film transistor in the second region, so that a ratio of the overlapped area between the source electrode or the drain electrode and the active layer of the thin film transistor to the thickness of the active layer is kept uniform over the first region and the second region.

In an embodiment of the present disclosure, a length of an overlapped portion between the source electrode or the drain electrode and the active layer of the thin film transistor is a width of a channel region of the active layer, and a width of the overlapped portion is a fixed value. The ratio of the width of the channel region of the active layer of the thin film transistor to the thickness of the active layer is kept uniform over the first region and the second region.

In an embodiment of the present disclosure, a curve of the variation of the thickness of the active layer of each thin film transistor in at least one of the first region and the second region is represented by a fitting function as a function of the position of the active layer. The overlapped area between the source electrode or the drain electrode and the active layer of each thin film transistors in the at least one region changes in proportion to the fitting function.

In an embodiment of the present disclosure, a curve of the variation of the thickness of the active layer of each thin film transistor in at least one of the first region and the second region is represented by a fitting function as a function of the position of the active layer. The width of the channel region of the active layer of each thin film transistors in at least one region changes in proportion to the fitting function.

In an embodiment of the present disclosure, the first region and the second region are periodically and alternately arranged.

In an embodiment of the present disclosure, the thin film transistor comprises a driving thin film transistor for applying a driving current to the organic light emitting diode and a switching thin film transistor for applying a driving voltage to the driving thin film transistor.

In an embodiment of the present disclosure, the thin film transistor comprises a switching thin film transistor for applying a data voltage to a liquid crystal layer.

According to a second aspect of the present disclosure, there is provided a method for manufacturing an array substrate. The method comprises a step of: obtaining variation of a thickness of an active layer according to a position on the substrate. The active layer has at least a first region with a larger thickness and a second region with a smaller thickness. The method further comprises a step of: determining an overlapped area between a source electrode or a drain electrode and the active layer of the thin film transistor to be formed according to the variation such that a ratio of the overlapped area to the thickness of the active layer is kept uniform over the first region and the second region. The method further comprises: forming the thin film transistor on the substrate such that the formed thin film transistor has the determined overlapped area.

In an embodiment of the present disclosure, a length of an overlapped portion between the source electrode or the drain electrode and the active layer of the thin film transistor is a width of a channel region of the active layer, and a width of the overlapped portion is a fixed value. The determining the overlapped area comprises determining a width of the channel region of the active layer to be formed such that the ratio of the width of the channel region of the active layer to the thickness of the active layer is kept uniform over the first region and the second region.

In an embodiment of the present disclosure, in the method as mentioned above, the obtaining the variation of the thickness of the active layer according to the position of active layer on the substrate comprises: forming an active film on a test substrate that is the same as the substrate. The obtaining the variation further comprises measuring thicknesses of the active film in the first region and the second region.

In an embodiment of the present disclosure, in the method as mentioned above, the determining the overlapped area comprises: determining a fitting function of a curve of the variation of the thickness of the active layer in at least one of the first region and the second region as a function of the position of the active layer based on the measured thickness of the active film. The determining the overlapped area further comprises determining the overlapped area in the at least one area such that the overlapped area varies in proportion to the fitting function.

In an embodiment of the present disclosure, in the method as mentioned above, determining the width of the channel region of the active layer to be formed comprises: determining a fitting function of a curve of the variation of the thickness of the active layer in at least one of the first region and the second region as a function of the position of the active layer active film based on the measured thickness of the active film. The determining the width of the channel region of the active layer to be formed further comprises determining a width of a channel region of the active layer in the at least one region such that a width of the channel region of the active layer varies in proportion to the fitting function.

In an embodiment of the present disclosure, forming a thin film transistor on a substrate comprises: forming a gate electrode on the substrate. The forming a thin film transistor on a substrate further comprises: forming a gate insulating layer on the gate electrode. The forming a thin film transistor on a substrate further comprises: forming an active film on the gate insulating layer. The forming a thin film transistor on a substrate further comprises: patterning the active film to form an active layer. The forming a thin film transistor on a substrate further comprises: forming a source electrode and a drain electrode on the active layer.

In an embodiment of the present disclosure, after the active film or the active layer is formed, the variation is obtained and the overlapped area is determined.

BRIEF DESCRIPTION OF THE DRAWINGS

In order to describe the technical solutions in the embodiments of the present disclosure more clearly, the accompanying drawings of the embodiments are briefly described in the following. It is apparent that the structural schematic views in the following figures are not necessarily drawn to scale, but instead, the features are presented in a simplified form. Moreover, the accompanying drawings in the following description relate to only some embodiments of the present disclosure, and are not to limit the present disclosure.

DETAILED DESCRIPTION

In order to make the objectives, technical solutions and advantages of the embodiments of the present disclosure definite, the technical solutions of the embodiments of the present disclosure will be clearly and completely described in the following in conjunction with the accompanying drawings. It is apparent that the described embodiments are only a part of the embodiments of the present disclosure and not all of the embodiments. All of other embodiments obtained by those skilled in the art based on the illustrated embodiments of the present disclosure without any inventive labors fall within the scope of the present disclosure.

Embodiments of the present disclosure provide an array substrate, a method for manufacturing the same, a display panel and a display device, which may improve the display performance. Hereinafter, the array substrate and the method for manufacturing the same, the display panel and the display device of the present disclosure will be specifically described in the corresponding embodiments.

Figure 1A:
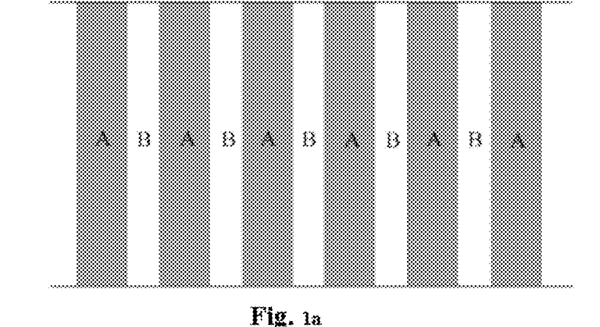
FIG. 1a is a schematic top view and FIG. 1b is a schematic cross sectional view of an active film formed on a substrate of an array substrate in the prior art.
Figure 1B:
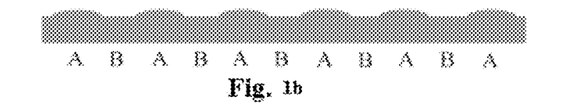

FIGS. 1a and 1b are schematic top and cross sectional views of an active film formed on a substrate of an array substrate by utilizing an existing magnetron sputtering device with a rotating target. The magnetron sputtering device is a device which utilizes an orthogonal electromagnetic field formed on a target surface to confine electron beams in a specific region of the target surface to improve ionization efficiency, increase plasma density and energy, thereby enabling forming film in a high sputtering rate. The magnetron sputtering device typically comprises a planar target magnetron sputtering devices and rotary target magnetron sputtering devices. No matter which type of magnetron sputtering device, since there is a gap between target materials and a magnetic field distribution on the magnetron sputtering device is not uneven, there will be thickness difference of the deposited film at different positions on the substrate. As shown in FIGS. 1a and 1b, there is a periodic difference in the thickness of the thin film deposited on a substrate by using a conventional rotary target magnetron sputtering device. The film is thicker at the position directly opposite to the target as shown in region A in FIGS. 1a and 1b (corresponding to the "first region" in the claims) while the film is thinner at a position between the targets as shown in region B in FIGS. 1 and 1b (corresponding to the "second region" in the claims), where the widths of the Region A and the Region B are of the order of a few centimeters (for example, about 8 centimeters). Such a periodic variation in the thickness of the film results in differences in the operating performance of thin film transistors (TFTs) formed on the region A and Region B of the substrate, which eventually leads to a so-called Target Mura (i.e., display unevenness) phenomenon. In the following, an organic light emitting diode (OLED) array substrate will be taken as an example to illustrate the problem caused by the difference in film thickness between the Region A and the Region B.

Figure 2:
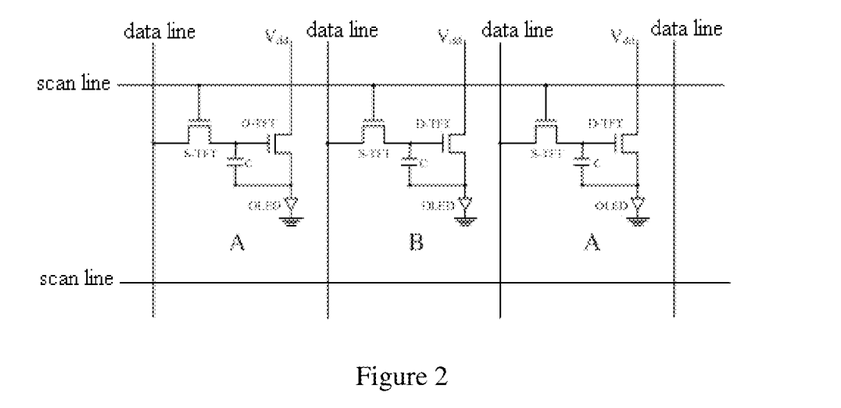
FIG. 2 is a schematic circuit diagram of an array substrate in which the principles of the present disclosure is applied.

FIG. 2 is a schematic circuit diagram of an OLED array substrate in which the principles of the present disclosure is be applied. As shown in FIG. 2, the array substrate comprises a plurality of scan lines and a plurality of data lines, which define a plurality of rectangular pixel units. Each of the pixel units comprises a switching TFT (i.e. S-TFT), a charge storage capacitor C, a driving TFT (i.e. D-TFT) and an OLED. When a display panel provided with the array substrate operates normally, each of the scanning lines is sequentially driven with, for example, a signal having a high level VGH, so that all of the switching TFTs connected to the scanning line are turned on. In synchronization with the scanning of the scanning lines, the respective data lines records the data signal voltage to the charge storage capacitor C through the turned-on switching TFT, while the data signal voltage turns on the driving TFT to output the driving current, i.e. the source-drain current (wherein Vdd is an operation voltage for driving TFT), so that the OLED emits lights with corresponding color and intensity. When the scanning of the scanning line is completed, the switching TFT is turned off, the recorded data signal voltage is maintained to continuously drive the driving TFT to output the corresponding driving current, so that the OLED continuously emits lights with the corresponding color and intensity until the next frame is scanned.

Figure 3A:
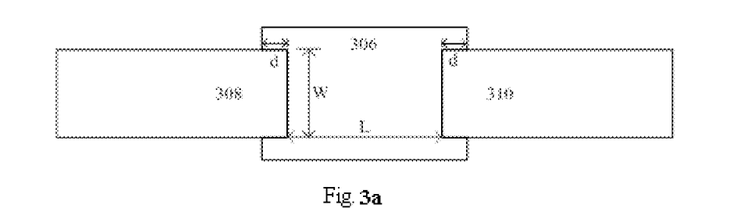
FIG. 3a is a schematic top view and FIG. 3b is a schematic cross sectional view of a thin film transistor in which the principle of the present disclosure is applied.
Figure 3B:
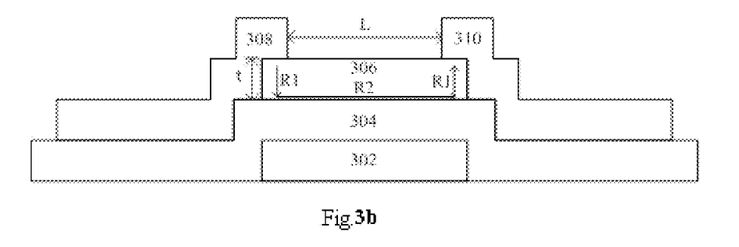

The switching TFT and the driving TFT may utilize the exemplary structure as shown in FIGS. 3a and 3b. FIGS. 3a and 3b are top and cross sectional schematic structural diagrams of a staggered bottom-gate TFT. As shown in FIGS. 3a and 3b, the staggered bottom-gate TFT comprises a gate electrode 302 formed on a substrate, which may be made of a material such as metal, indium tin oxide, or the like; a gate insulating layer 304 formed on the gate electrode 302, which may be made of an insulating material (e.g. $SiO_2$, $Al_2O_3$, organic insulating material or the like); an active layer 306 formed on the gate insulating layer 304, which may be made of an inorganic and organic semiconductor material (e.g. IGZO, InSb, polythiophene or the like); and a source electrode 308 and a drain electrode 310 formed on the active layer 306, which may be made of a material such as metal, indium tin oxide, or the like.

As illustrated in FIGS. 1a and 1b, there is a periodic difference in film thickness of a thin film deposited on a substrate by using the existing rotary target magnetron sputtering device. In the case of the OLED array substrate shown in FIG. 2, since the widths of the Region A and the Region B are of the order of a few centimeters and the width of the pixel unit is of the order of several tens of micrometers (e.g. about 50 micrometers), the Region A and Region B both include a plurality of pixel units. Only one pixel unit is schematically illustrated in FIG. 2. In addition, since the thickness of the active film in the region A is large and the thickness of the active film in the region B is small, there is a difference in the source-drain current (i.e. driving current) of the driving TFT formed in the Region A and the region B, which leads to difference in the color and intensity of light emitted by the OLEDs in the Region A and the Region B at the same driving voltage, resulting in the Target Mura phenomenon.

In order to eliminate such a Target Mura phenomenon, it is acknowledge in the present disclosure that when the TFT is in an operating state, as shown by arrow in FIGS. 3a and 3b, the current flowing in the active layer is in a U-shaped loop which involves resistance R=2R1+R2, where R1 is a resistance in a vertical direction below the source/drain electrodes and R2 is a resistance in the horizontal direction of the channel region. Due to the resistance of the conductive channel region is far less than the resistance in a vertical direction below the source/drain electrodes, i.e., R2<<R1, the loop resistance is approximately represented as R≈2R1. According to a calculation formula of the resistance, the loop resistance of the active layer may be expressed as: R=2R1=2ρ×t/(W×d)=2ρ×t/S, where ρ is a resistivity of the active film; t is a thickness of the active layer; S=W×d is an overlapped area between the source electrode 308 or the drain electrode 310 and the active layer 306; W is a length of the overlapped portion between the source electrode 308 or the drain electrode 310 and the active layer 306, i.e., the size of the overlapped portion between source electrode 308 or the drain electrode 130 and the active layer 306 in a direction perpendicular to a cross section of the TFT (i.e., the width of the channel region of the active layer); d is the width of the overlapped portion, i.e., the size of the overlapped portion between source electrode 308 or the drain electrode 130 and the active layer 306 in a direction parallel to the cross section of the TFT; and L as shown in the drawing is a distance between the source electrode 308 and the drain electrode 310 in the direction perpendicular to the cross section of the TFT (i.e. the length of the channel region of the active layer).

According to an formula of I=U/R indicating relationship between a current I and a voltage U, the current $I_{DS}$ flowing between a source and drain electrodes of a TFT may be expressed as follows:

$$I_{DS}=U_{DS}/R=U_{DS}\times S/(2\rho \times t)=U_{DS}\times W\times d/(2\rho \times t),$$

In which $U_{DS}$ is a voltage difference between the source and drain electrodes of the TFT. Therefore, $I_{DS}$ is in proportion to the overlapped area S between the source electrode 308 or the drain electrode 310 and the active layer 306 and is inversely proportional to the thickness t of the active film when the voltage difference $U_{DS}$ is constant. In addition, since the width d of the overlapped portion should not be too large (resulting in an increase of the size of the TFT) or too small (resulting in a decrease of the on-state current of the TFT), d is usually fixed to a preferable value. Therefore, in an embodiment of the present disclosure, the width d of the overlapped portion may be a fixed value, and in such a situation, $I_{DS}$ is in proportion to the width W of the channel region of the active layer and is inversely proportional to the thickness t of the active film.

In fact, the above formula may be transformed as $I_{DS}=1/(2\times\rho)\times U_{DS}\times(W\times d/t)$, where $1/(2\times\rho)\times Up_{DS}$ may be considered as a constant. Thus, IDs is only in proportion to (W×d)/t, i.e., S/t, where S is the overlapped area and is equal to W×d.

Therefore, according to the embodiment of the present disclosure, since the film thickness $t_A$ of the active film in the region A is greater than the film thickness $t_B$ of the active film in the region B, the overlapped area $S_A$ between the source electrode 308 or the drain electrode 310 and the active layer 306 in the Region A is set to be larger than the overlapped area $S_B$ between the source electrode 308 or the drain electrode 310 and the active layer 306 in the Region B, so that a ratio S/t of the overlapped area S between the source electrode 308 or the drain electrode 310 and the active layer 306 to the thickness t of the active film are kept uniform in the Region A and the Region B. In this way, the source/drain current $I_{DS}$ of the TFT in the Region A and the Region B is kept uniform under the same driving voltage so that the color and intensity of the light emitted by the OLED in the Region A and the Region B is kept uniform, thereby eliminating the Target Mura phenomenon. Accordingly, in the above-mentioned embodiment in which the width d of the overlapped portion is a fixed value, a ratio W/t of the width W of the channel region of the active layer to the thickness t of the active film is kept uniform in the Region A and the Region B. It is understood that in another embodiment, a thickness of an active film in region A may be less than a thickness of an active film in region B. Accordingly, an overlapped area between a source electrode 308 or a drain electrode 310 and an active layer 306 in the region A is less than an overlapped area between a source electrode 308 or a drain electrode 310 and an active layer 306 in the region B.

In order to keep S/t or W/t of the active layer uniform in the Region A and the Region B, it is considered that the thickness of the active film formed on the substrate of the array substrate is kept substantially constant for different substrates when the process conditions are stable. Thus, it may obtain variation of the thickness of the active film depending on its position on the substrate (e.g. the active film is formed on a test substrate that is the same as the substrate, and the variation of the thickness of the active film is measured depending on the positions), determine the overlapped area S or the channel width W of the corresponding active layer based on the measured thickness t of the respective films, and then design a corresponding mask to implement the determined overlapped area S or channel Area width W.

However, the present disclosure is not limited to the above example. In another example, it may also obtain the variation of the thickness of the active film depending on its position on the substrate during formation of the TFT, and determine the overlapped area S of the corresponding active layer and the width W of the channel region based on the measured thickness of the films. As mentioned above, in FIGS. 3a and 3b, the active layer 306 is formed first, and then the source electrode 308 and the drain electrode 310 are further formed. In such a situation, the thickness of the respective active layers 306 in the Region A and the Region B may be measured after the active film or the active layer 306 is formed, and the overlapped area S of the corresponding active layer or the width W of the channel region is determined based on the measured thicknesses t, such that S/t or W/t for the active layer is kept uniform in the Region A and the Region B. Then, the source electrode 308 and the drain electrode 310 may be formed so that the formed active layer has the determined overlapped area S or channel width W. As can be seen from the plan view of FIGS. 3a and 3b corresponding to the cross-sectional view, the overlapped area S of the active layer or the width W of the channel region may be adjusted by patterns of the source electrode 308 and the drain electrode 310. Therefore, the determined overlapped area S or the width W of the channel region may be implemented by, for example, designing and manufacturing a mask for forming the source electrode 308 and/or the drain electrode 310.

As mentioned above, the widths of the Region A and the Region B are of the order of several centimeters, and the size of the TFT is about 5 to 30 micrometers. Therefore, for the Region A whose film thickness varies in a curve with positions, if the thickness at corresponding positions of the respective TFTs in the Region A needs to be measured, it is necessary to measure the thickness at a very large number of locations. In order to improve the efficiency, taking into account the curve of the film thickness in the Region as a function of the position as shown in FIGS. 1a and 1b being approximately axisymmetric, it is possible to measure the thickness of the film at relatively large interval (e.g. 300-500 micrometers), and to determine the fitting function of the film thickness depending on the position based on the measured thickness values. In this way, the film thickness at any points in the Region A may be determined by substituting the coordinates of the point into the fitting function. According to the above configuration, only the thickness of the active layer at a small number of positions may be measured, and then the determined fitting function may be used to determine the thickness of the active layer at unmeasured positions and in turn to determine the overlapped area corresponding to respective thicknesses, thereby increasing efficiency.

Figure 4:
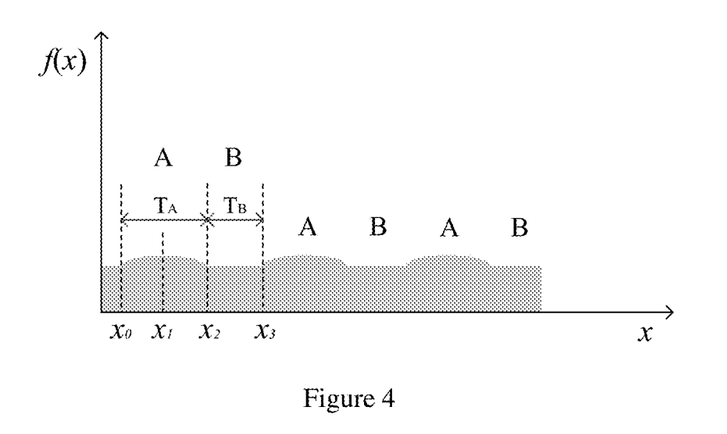
FIG. 4 shows a fitting function of a curve of the variation of the thickness of an active film formed on an array substrate according to its position according to the prior art.

FIG. 4 shows a fitting function of the thickness, depending on positions, of an active film formed on a substrate of an array substrate by using a conventional rotary target magnetron sputtering device, wherein $T_A$ is a period of the Region A, $T_B$ is the period of the Region B, and the x coordinate indicates the coordinates for the Region A and the Region B in the width direction. It is assumed that an expression for a fitting function determined by utilizing the coordinates of a plurality of points at a half period $[x_0, x_1]$ of the Region A and the measured film thickness through a fitting algorithm is indicated as follows:

$$f(x) = a_0 + a_1(x - x_0) + a_2(x - x_0)^2 + a_3(x - x_0)^3,$$

In which, $a_0$, $a_1$, $a_2$ and $a_3$ are coefficients obtained by utilizing the fitting algorithm. Thus, an expression for the fitting function at another half period $[x_1, x_2]$ of the Rgion A may be indicated as follows:

$$f(x) = a_0 + a_1(T_A + x_0 - x) + a_2(T_A + x_0 - x)^2 + a_3(T_A + x_0 - x)^3.$$

Since the ratio of S/T or W/t for the active layer is kept uniform in the Region A and the Region B, an expression g(x) of the curve of the variation of the overlapped area S of the active layer depending on the position within one period of $[x_0, x_3]$ constituted of the Region A and the Region B may be expressed as follows:

$$g(x) = \begin{cases} (S_0/a_0) \cdot [a_0 + a_1(x - x_0) + a_2(x - x_0)^2 + a_3(x - x_0)^3], x \in [x_0, x_1] \\ (S_0/a_0) \cdot [a_0 + a_1(T_A + x_0 - x) + a_2(T_A + x_0 - x)^2 + a_3(T_A + x_0 - x)^3], \\ \qquad x \in [x_1, x_2] \\ S_0, x \in [x_2, x_3] \end{cases},$$

In which $(S_0/a_0)$ is a ratio of S/t of the active layer in the Region B. Accordingly, the expression h(x) of the curve of the width W of the channel region of the active layer as a function of the position may be expressed as:

$$h(x) = \begin{cases} (W_0/a_0) \cdot [a_0 + a_1(x - x_0) + a_2(x - x_0)^2 + a_3(x - x_0)^3], x \in [x_0, x_1] \\ (W_0/a_0) \cdot [a_0 + a_1(T_A + x_0 - x) + a_2(T_A + x_0 - x)^2 + a_3(T_A + x_0 - x)^3], \\ \qquad x \in [x_1, x_2] \\ W_0, x \in [x_2, x_3] \end{cases},$$

in which $(W_0/a_0)$ is a ratio of W/t for the channel region of the active layer in the region B. For x in the ranges of other periods, it may be deduced the rest from this. It should be noted that the coordinate x may be varied in a certain range within the space occupied by a TFT. For example, for a TFT of 10 μm, a thickness of 5 μm may be used as the thickness of the entire TFT, or an average value of the thicknesses in the range of 0 to 10 μm may be used as the thickness of the entire TFT. In addition, in the case of the rotary target magnetron sputtering device of the present example, the thickness of the active film in the Region B varies little with positions, so it is not necessary to fit a function of the thickness of the film in the Region B with the positions. However, for example, if the thickness of the active film formed by other processes varies greatly with the positions in at least one of the region having a larger film thickness and the region having a smaller film thickness (for example, a change of the film thickness corresponding to a predetermined change of positions is larger than a threshold value), the functionally fitting may be implemented for the at least one region. By this way, only the thickness of the active layer at a small number of positions may be measured to increase efficiency.

It should be noted that the present disclosure is not limited to the examples as mentioned above. For example, the process which leads to difference of the film thickness of the active film at different positions is not limited to the magnetron sputtering, but may be other sputtering (for example, a normal sputtering without using magnetron) or may be other film forming process (For example, evaporation). For example, the array substrate in which the principles of the present disclosure may be applied is not limited to the OLED array substrate. As another example, the array substrate may also be an array substrate for an LCD display panel. Similar to the OLED array substrate as mentioned above, the LCD array substrate may comprise a plurality of scan lines and a plurality of data lines, which define a plurality of rectangular pixel units. Each of the pixel units comprises a switching TFT, a holding capacitor C and a liquid crystal layer. When the display panel provided with the LCD array substrate operates normally, for example, each of the scanning lines is sequentially driven with a signal having a high level of VGH, so that all of the switching TFTs connected to the scanning line are turned on. In synchronization with the scanning of the scanning lines, the respective data lines records the data signal voltage to the charge storage capacitor C through the turned-on switching TFT. When the scanning for the scan lines is completed, the switching transistor is turned off, the recorded data signal voltage is maintained to continuously drive the driving TFT until the next frame is scanned. By applying the embodiment of the present disclosure to the LCD array substrate, since the source-drain currents of the switching TFTs formed in the regions having different thicknesses may be kept uniform under the same driving conditions, the data signal voltage recorded on the holding capacitor through the source-drain current may also be kept uniform, thereby improving the display effect of the LCD display panel. As a further example, the array substrate may also be an array substrate for an electrowetting display panel.

In addition, the OLED array substrate is not limited to the configuration of 2T1C (constituted of two TFTs and one capacitor), and may be a configuration of 3T1C (constituted of three TFTs and one capacitor) or various other existing configurations including TFTs. Moreover, in the embodiment of the OLED array substrate as mentioned above, only the width W of the channel region of the driving TFT may be adjusted, and both of the widths W of the channel region of the driving TFT and the switching TFT may be adjusted to further improve the display effect. In addition, the TFTs disposed on the array substrate are not limited to the driving TFT and the switching TFT for controlling the pixel unit, and may also be TFTs in a driving module for controlling the scanning lines and/or data lines, for example. To sum up, it is appreciated for those skilled in the art that the principle of the present disclosure may be applied to any type of array substrate provided with a TFT as long as the thickness of the active film formed when manufacturing the TFT is different at different positions, and the TFT in the turned-on state forms the U-type current loop in the active layer. Furthermore, the TFT whose width W of the channel region is adjusted according to the film thickness t may be a TFT or any combination thereof that performs any one of the functions on the array substrate.

That is to say, at least one embodiment of the present disclosure provides an array substrate including a thin film transistor and comprising at least a first region and a second region. A thickness of an active layer of the thin film transistor in the first region is greater than that of an active layer of the thin film transistor in the second region, and an overlapped area between the source electrode or drain electrode and the active layer of the thin film transistor in the first region is larger than that between the source electrode or the drain electrode and the active layer of the thin film transistor in the second region, so that a ratio of the overlapped area between the source electrode or the drain electrode and the active layer of the thin film transistor to the thickness of the active layer is kept uniform over the first region and the second region. In another embodiment, a thickness of an active layer of a thin film transistor in the first region is less than a thickness of an active layer of a thin film transistor in the second region, and an overlapped area between the source electrode or drain electrode and the active layer of the thin film transistor in the first region is less than that between the source electrode or the drain electrode and the active layer of the thin film transistor in the second region, so that a ratio of the overlapped area between the source electrode or the drain electrode and the active layer of the thin film transistor to the thickness of the active layer is kept uniform over the first region and the second region.

Embodiments of the present disclosure provided a display panel including the array substrate as mentioned above. Accordingly, a display device (e.g. an OLED display device, an LCD display device, etc.) according to an embodiment of the present disclosure also comprises the array substrate as mentioned above. Since the array substrate as mentioned above is used, the display effect of the display panel and the display device may be improved, and details are omitted for brevity.

Figure 5:
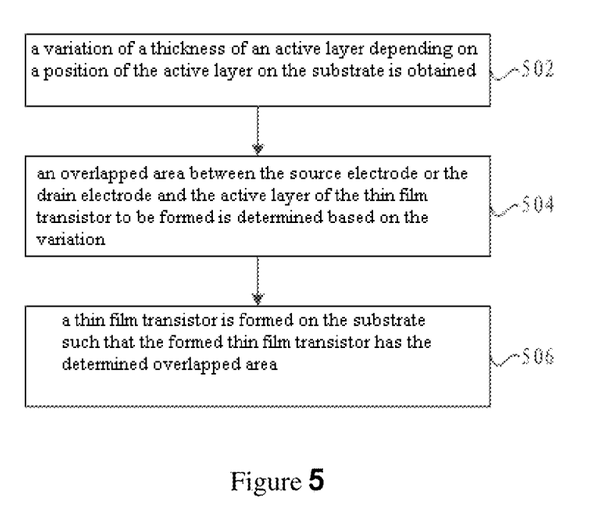
FIG. 5 is a flowchart of a method for manufacturing an array substrate according to an embodiment of the present disclosure.

Embodiments of the present disclosure further provide a method of manufacturing an array substrate. FIG. 5 is a flowchart of a method for manufacturing an array substrate according to an embodiment of the present disclosure. As shown in FIG. 5, the method for manufacturing the array substrate comprises steps of 502, 504 and 506.

At the step 502, a variation of a thickness of an active layer depending on a position of the active layer on the substrate is obtained. The active layer comprises at least a first region with a first thickness and a second region with a second thickness, the first thickness being larger than the second thickness (similar the above text, the first thickness may be less than the second thickness). For example, the step 502 may comprise the following two sub-steps as mentioned above. At the first sub-step, a active film is formed on a test substrate that is the same as the substrate. The active film may be directly formed on the test substrate, or the active film may be formed from the first step of the process for normally manufacturing the TFT until the active film is formed. In the second sub-step, thicknesses of the active film in the first region and the second region are measured. Such a step may be implemented by any existing method for measuring the thickness of a film.

Next, in the step 504, an overlapped area between the source electrode or the drain electrode and the active layer of the thin film transistor to be formed is determined based on the variation such that a ratio of the overlapped area to the thickness of the active layer is kept uniform over the first region and the second region. As mentioned above, in one embodiment of the present disclosure, the width d of the overlapped portion is a fixed value. In such a situation, a width of the channel region of the active layer to be formed is determined based on the variation such that the ratio of the width of the channel region of the active layer to the thickness of the active layer is kept uniform over the first region and the second region.

In addition, as mentioned above, the thickness of the corresponding position of each TFTs in the first region and the second region may be measured, which requires measuring the thickness at a very large number of positions. In order to improve efficiency, it is also possible to measure the thickness every relatively large intervals (e.g. every 300-500 micrometers) and to determine the fitting function of the curve of the variation of the thickness of the film as a function of the position based on the measured thickness.

The details of the fitting function and the details of determining the overlapped area of the active layer or the width of the channel region by using the fitting function have been described in detail above and here will be omitted for brevity.

At the step 506, a thin film transistor is formed on the substrate such that the formed thin film transistor has the determined overlapped area. Accordingly, in the embodiment in which the width d of the overlapped portion is a fixed value, a thin film transistor is formed on the substrate such that the formed channel region of the active layer has the determined width. For example, the determined overlapped area S or the determined width W of the channel region may be implemented by designing and manufacturing one or more masks for forming a thin film transistor.

Figure 6:
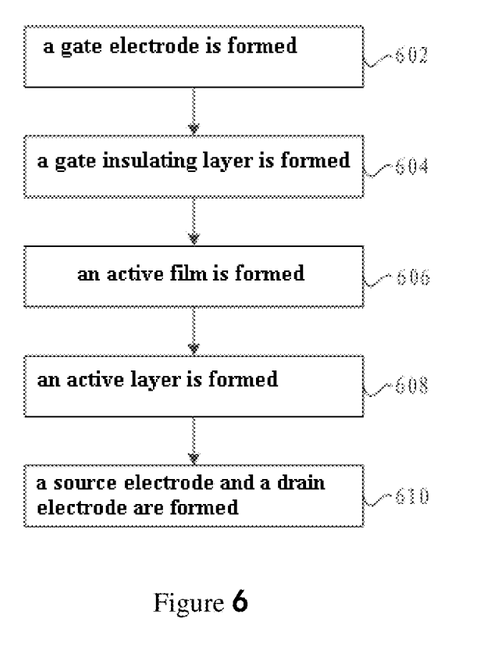
FIG. 6 further illustrate the flowchart of the method of FIG. 5.

As an example, the implementation of the thin film transistor may be as shown in FIG. 6, which corresponds to the staggered bottom-gate TFT as shown in FIGS. 3a and 3b. In such a situation, the step of forming the thin film transistor comprises steps of 602-610. At the step 602, a gate electrode is formed on the substrate, which may be implemented by deposition and photolithography processes. For example, the gate electrode may be formed on the substrate by sequentially depositing a gate electrode material layer, applying a photoresist, exposing by using a mask, developing with a developer, etching with an etchant solution, and peeling off the photoresist. At the step 604, a gate insulating layer is formed on the gate electrode, which may be implemented by using a deposition process by using deposition and photolithography processes. At the step 606, an active film is formed on the gate insulating layer, which may be implemented by sputtering, evaporating or the like. At the step 608, the active film is patterned to form an active layer, which may be implemented by photolithography. At the step 610, a source electrode and a drain electrode are formed on the active layer, which may be implemented by deposition and photolithography processes.

However, the present disclosure is not limited to the examples as mentioned above. As another example, the steps 502 and 504 may also be implemented during the step 506. For example, in the example as shown in FIG. 6, the active layer is formed first, and then the source electrode and the drain electrode are formed. Therefore, the steps 502 and 504 may be implemented while or after the active film or the active layer is formed (i.e. after the step 606 or 608 in FIG. 6). In this way, after the overlapped area of the active layer to be formed or the width of the channel region is determined in the step 504, the source electrode and the drain electrode may be formed in the step 610 to implement the determined overlapped area or the width of the channel region. As mentioned above, the determined overlapped area or the width of the channel region may be implemented, for example, by designing and manufacturing a mask for forming the source and/or drain electrodes.

To sum up, at least one embodiment of the present disclosure provides method for manufacturing an array substrate, which comprises a step of: obtaining variation of a thickness of an active layer depending on a position of the active layer on the substrate. The active layer has at least a first region with a first thickness and a second region with a second thickness, the first thickness being larger than second thickness. The method further comprises a step of determining an overlapped area between the source electrode or the drain electrode and the active layer of the thin film transistor to be formed based on the variation such that a ratio of the overlapped area to the thickness of the active layer is kept uniform over the first region and the second region. The method further comprises a step of forming a thin film transistor on the substrate such that the formed thin film transistor has the determined overlapped area.

In this way, since the ratio of the overlapped area between the source electrode or the drain electrode and the active layer of the thin film transistor to the thickness of the active layer is kept uniform over the first region and the second region, the difference of the source and drain current of the thin film transistors in the first region and the second region due to the difference in the thickness of the active layer may be avoided, so that the control of the pixel unit by the array substrate is kept to be uniform over the first region and the second region so as to improve a display effect.

It should be noted that the above descriptions is only exemplary embodiments of the present disclosure, and is not intended to limit the scope of the present disclosure. The scope of the disclosure is defined by the appended claims.

The invention claimed is:

1. An array substrate comprising:
   at least a first region and a second region, each first region including a first thin film transistor and each second region including a second thin film transistor;
   wherein a thickness of an active layer of the first thin film transistor in the first region is greater than that of an active layer of the second thin film transistor in the second region; and
   wherein an overlapped area between a source electrode or a drain electrode and the active layer of the first thin film transistor in the first region is larger than that between a source electrode or a drain electrode and the active layer of the second thin film transistor in the second region, so that a ratio of the overlapped area between the source electrode or the drain electrode and the active layer to the thickness of the active layer for each of the first thin film transistor and the second thin film transistor is kept uniform over the first region and the second region.

2. The array substrate according to claim 1, wherein:
   a length of an overlapped portion between the source electrode or the drain electrode and the active layer of the each of the first and second thin film transistors is a width of a channel region of the active layer, and a width of the overlapped portion is a fixed value; and the ratio of the width of the channel region of the active layer to the thickness of the active layer for each of the first thin film transistor and the second thin film transistor is kept uniform over the first region and the second region.

3. The array substrate according to claim 2, wherein:
   a curve of a variation of the thickness of the active layer of the first and/or second thin film transistor in at least one of the first region and the second region depending on a position of the active layer is represented by a fitting function, and
   the width of the channel region of the active layer of the first and/or second thin film transistor in the at least one of the first region and the second region changes in proportion to the fitting function.

4. The array substrate according to claim 1, wherein the first region and the second region are periodically and alternately arranged.

5. The array substrate according to claim 1, wherein each of the first and second thin film transistors comprises a driving thin film transistor for applying a driving current to an organic light emitting diode and a switching thin film transistor for applying a driving voltage to the driving thin film transistor.

6. The array substrate according to claim 1, wherein each of the first and second thin film transistors comprises a switching thin film transistor for applying a data voltage to a liquid crystal layer.

7. A method for manufacturing an array substrate, comprising steps of:
obtaining a variation of a thickness of an active layer depending on a position on a substrate, the active layer having at least a first region with a larger thickness and a second region with a second thickness, the first thickness being larger than the second thickness;
determining an overlapped area between a source electrode or a drain electrode and the active layer of a thin film transistor to be formed according to the variation such that a ratio of the overlapped area to the thickness of the active layer is kept uniform over the first region and the second region; and
forming the thin film transistor on the substrate such that the formed thin film transistor has the determined overlapped area.

8. The method according to claim 7, wherein:
a length of an overlapped portion between the source electrode or the drain electrode and the active layer of the thin film transistor is a width of a channel region of the active layer, and a width of the overlapped portion is a fixed value; and
the step of determining the overlapped area comprises:
determining the width of the channel region of the active layer to be formed such that the ratio of the width of the channel region of the active layer to the thickness of the active layer is kept uniform over the first region and the second region.

9. The method according to claim 7, wherein the step of obtaining the variation of the thickness of the active layer depending on the position on the substrate comprises:
forming an active film on a test substrate that is the same as the substrate; and measuring a thickness of the active film in the first region and the second region.

10. The method according to claim 9, wherein the step of determining the overlapped area comprises:
determining a fitting function of a curve of the variation of the thickness of the active layer in at least one of the first region and the second region depending on the position of the active layer based on the measured thickness of the active film; and
determining the overlapped area in the at least one area such that the overlapped area varies in proportion to the fitting function.

11. The method according to claim 8, wherein the step of obtaining the variation of the thickness of the active layer depending on the position on the substrate comprises:
forming an active film on a test substrate that is the same as the substrate: and measuring a thickness of the active film in the first region and the second region.

12. The method according to claim 11, wherein the step of determining the width of the channel region of the active layer to be formed comprises:
determining a fitting function of a curve of the variation of the thickness of the active layer in at least one of the first region and the second region depending on the position of the active layer based on the measured thickness of the active film; and
determining the width of the channel region of the active layer in the at least one region such that the width of the channel region of the active layer varies in proportion to the fitting function.

13. The method according to claim 7, wherein the step of forming the thin film transistor on the substrate comprises:
forming a gate electrode on the substrate;
forming a gate insulating layer on the gate electrode;
forming an active film on the gate insulating layer;
patterning the active film to form the active layer; and
forming the source electrode and the drain electrode on the active layer.

14. The method according to claim 13, wherein the variation is obtained and the overlapped area is determined after the active film or the active layer is formed.

15. The array substrate according to claim 2, wherein the first region and the second region are periodically and alternately arranged.

16. The array substrate according to claim 2, wherein the thin film transistor comprises a driving thin film transistor for applying a driving current to an organic light emitting diode and a switching thin film transistor for applying a driving voltage to the driving thin film transistor.

17. The array substrate according to claim 2, wherein the thin film transistor comprises a switching thin film transistor for applying a data voltage to a liquid crystal layer.

18. An array substrate comprising a thin film transistor, wherein the array substrate comprises at least a first region and a second region; a thickness of an active layer of the thin film transistor in the first region is greater than that of an active layer of the thin film transistor in the second region, and an overlapped area between a source electrode or a drain electrode and the active layer of the thin film transistor in the first region is larger than that between a source electrode or a drain electrode and the active layer of the thin film transistor in the second region, so that a ratio of the overlapped area between the source electrode or the drain electrode and the active layer of the thin film transistor to the thickness of the active layer is kept uniform over the first region and the second region;
wherein a curve of a variation of the thickness of the active layer of the thin film transistor in at least one of the first region and the second region depending on a position of the active layer is represented by a fitting function, and the overlapped area between the source electrode or the drain electrode and the active layer of the thin film transistor in the at least one of the first region and the second region changes in proportion to the fitting function.

* * * * *